US012643668B2

(12) United States Patent
Gundu et al.

(10) Patent No.:  US 12,643,668 B2
(45) Date of Patent:      Jun. 2, 2026

(54) MODULAR FLEXIBLE SMART MULTI ELECTRODE AIR IONIZER

(71) Applicant: B/E Aerospace, Inc., Winston Salem, NC (US)

(72) Inventors: Srinivas Magaji Gundu, Bangalore (IN); Hemanth Raghav Gajendra, Bangalore (IN); Sai Sankalp Shekar, Bengaluru (IN)

(73) Assignee: B/E AEROSPACE, INC., Winston Salem, NC (US)

( * ) Notice: Subject to any disclaimer, the term of this patent is extended or adjusted under 35 U.S.C. 154(b) by 384 days.

(21) Appl. No.: 18/523,618

(22) Filed: Nov. 29, 2023

(65) Prior Publication Data

US 2025/0108924 A1     Apr. 3, 2025

(30) Foreign Application Priority Data

Sep. 28, 2023    (IN) .............................. 202341065133

(51) Int. Cl.
*H01T 23/00*          (2006.01)
*B64D 13/06*          (2006.01)
(Continued)

(52) U.S. Cl.
CPC ........... *B64D 13/06* (2013.01); *H05K 1/0254* (2013.01); *H05K 1/0393* (2013.01); *H05K 3/361* (2013.01);
(Continued)

(58) Field of Classification Search
CPC .................................................... B64D 13/06
See application file for complete search history.

(56) References Cited

U.S. PATENT DOCUMENTS 4,757,421 A      7/1988   Mykkanen
4,951,172 A      8/1990   Steinman et al.
(Continued)

FOREIGN PATENT DOCUMENTS

CN       114620233       6/2022
PT          2697875      11/2016
WO       2020263171      12/2020

OTHER PUBLICATIONS

European Patent Office, European Search Report dated Feb. 3, 2025 in Application No. 24203383.5.

*Primary Examiner* — Stephen W Jackson
(74) *Attorney, Agent, or Firm* — SNELL & WILMER L.L.P.

(57)              ABSTRACT

An electrode module for use in an air ionizer system is disclosed herein. The electrode module includes a first printed circuit board extending in a first direction from a first edge to a second edge, a first positive high voltage track formed on the first printed circuit board, the first positive high voltage track extending in the first direction, a first negative high voltage track formed on the first printed circuit board, the first negative high voltage track being spaced apart from the first positive high voltage track by a first distance in a second direction perpendicular to the first direction, a first ion sense trace formed on the first printed circuit board, a first ion probe attached to the first printed circuit board and the first ion sense trace, and a first connector coupled to the first positive high voltage track and configured to receive a first ion emitter.

20 Claims, 8 Drawing Sheets

(51) Int. Cl.
    *H05K 1/02*         (2006.01)
    *H05K 1/03*         (2006.01)
    *H05K 3/36*         (2006.01)

(52) U.S. Cl.
    CPC .................. *B64D 2013/067* (2013.01); *H05K*
                           *2201/10151* (2013.01)

(56)                   References Cited

U.S. PATENT DOCUMENTS

| | | | | |
|---|---|---|---|---|
| 5,550,703 | A | 8/1996 | Beyer et al. | |
| 7,431,752 | B2 | 10/2008 | Liang | |
| 8,861,166 | B2 | 10/2014 | Richie et al. | |
| 9,843,250 | B2 | 12/2017 | Tsoi et al. | |
| 10,786,818 | B2 * | 9/2020 | Galbreath | B03C 3/41 |
| 10,925,985 | B2 | 2/2021 | Hogsett et al. | |
| 12,415,210 | B2 * | 9/2025 | Gajendra | B08B 13/00 |
| 2010/0157503 | A1 | 6/2010 | Saito et al. | |
| 2017/0283075 | A1 * | 10/2017 | Garing | A61L 9/125 |
| 2020/0340950 | A1 * | 10/2020 | Mlcak | G01N 29/022 |
| 2021/0299678 | A1 | 9/2021 | Daryani et al. | |
| 2021/0322605 | A1 | 10/2021 | Hogsett et al. | |
| 2021/0332996 | A1 | 10/2021 | Bender et al. | |
| 2023/0211028 | A1 | 7/2023 | Miller et al. | |
| 2024/0400209 | A1 * | 12/2024 | Shekar | B64D 13/06 |

* cited by examiner

MODULAR FLEXIBLE SMART MULTI ELECTRODE AIR IONIZER

CROSS-REFERENCE TO RELATED APPLICATIONS

This application claims priority to, and the benefit of, India Provisional Patent Application No. 202341065133, filed Sep. 28, 2023 and titled "MODULAR FLEXIBLE SMART MULTI ELECTRODE AIR IONIZER," which is incorporated by reference herein in its entirety for all purposes FIELD The present disclosure generally relates to systems for managing air quality in an aircraft, and more specifically, to using air ionizers in an aircraft.

BACKGROUND

Travel within aircraft includes the recirculation of air within the aircraft. Circulation of air within an enclosed space, such as aircraft, may include circulation of harmful pathogens (e.g., viruses, bacteria, etc.) and undesirable odors. Currently, commercial aircraft use air filters, including high efficiency particulate air (HEPA) filters, to filter the air during recirculation. Generally, air filters are placed at central locations and therefore may not have continuous effectiveness within the enclosed space. Furthermore, more effective air filters, such as HEPA filters, come with an increased cost both in terms of the replaceable filter itself as well as the energy used to force air through the air filter. Furthermore, air filters, including HEPA filters, typically do not remove odors from the air within the enclosed space.

SUMMARY

An electrode module for use in an air ionizer system is disclosed herein. The electrode module includes a first printed circuit board extending in a first direction from a first edge to a second edge, a first positive high voltage track formed on the first printed circuit board, the first positive high voltage track extending in the first direction, a first negative high voltage track formed on the first printed circuit board, the first negative high voltage track being spaced apart from the first positive high voltage track by a first distance in a second direction perpendicular to the first direction, a first ion sense trace formed on the first printed circuit board, a first ion probe attached to the first printed circuit board and connected to the first ion sense trace, and a first connector coupled to the first positive high voltage track, the first connector configured to receive a first ion emitter.

In various embodiments, the first printed circuit board is a flexible printed circuit board including a polyimide material. In various embodiments, the first positive high voltage track extends a first length from the first edge in the first direction and the first ion sense trace extends a second length from the first edge in the first direction. In various embodiments, the first negative high voltage track extends the first length from the first edge in the first direction.

In various embodiments, the first ion sense trace being parallel to the first positive high voltage track. In various embodiments, the electrode module further includes an expansion stub coupled at the second edge of the first printed circuit board, the expansion stub configured to connect the first printed circuit board to a second printed circuit board. In various embodiments, the first ion probe is disposed adjacent the first connector.

Also disclosed herein is an air ionizer system including a high voltage module configured to output a high voltage, a digital module operatively coupled to the high voltage module and configured send instructions to the high voltage module to vary a high voltage output, an electrode module operatively coupled to the high voltage module. The electrode module includes a first printed circuit board extending in a first direction from a first edge to a second edge, a first positive high voltage track formed on the first printed circuit board, the first positive high voltage track extending in the first direction, a first negative high voltage track formed on the first printed circuit board, the first negative high voltage track being spaced apart from the first positive high voltage track by a first distance in a second direction perpendicular to the first direction, a first ion sense trace formed on the first printed circuit board, a first ion probe attached to the first printed circuit board and connected to the first ion sense trace, and a first connector coupled to the first positive high voltage track, the first connector configured to receive a first ion emitter.

In various embodiments, the air ionizer system further includes a second positive high voltage track formed on the first printed circuit board and inline with the first positive high voltage track, the second positive high voltage track extending in the first direction, and a second connector coupled to the second positive high voltage track, the second connector configured to receive a second ion emitter. In various embodiments, the air ionizer system further includes a third positive high voltage track formed on the first printed circuit board inline with and between the first positive high voltage track and the second positive high voltage track, the second positive high voltage track extending in the first direction, wherein an ion emitter of a plurality of ion emitters is coupled to alternating positive high voltage tracks.

In various embodiments, the first printed circuit board is a flexible printed circuit board including a polyimide material. In various embodiments, the first positive high voltage track extends a first length from the first edge in the first direction and the first ion sense trace extends a second length from the first edge in the first direction. In various embodiments, the first positive high voltage track extends a first length from the first edge in the first direction and the first ion sense trace extends a second length from the first edge in the first direction. In various embodiments, the digital module is configured to send the instructions to the high voltage module in response to a signal received from the first ion probe.

Also disclosed herein is an aircraft including a plurality of passenger seats, and an air ionizer system disposed over the plurality of passenger seats, the air ionizer system includes a high voltage module configured to output a high voltage, a digital module operatively coupled to the high voltage module and configured send instructions to the high voltage module to vary a high voltage output, an electrode module operatively coupled to the high voltage module, the electrode module includes a first printed circuit board extending in a first direction from a first edge to a second edge, a first positive high voltage track formed on the first printed circuit board, the first positive high voltage track extending in the first direction, a first negative high voltage track formed on the first printed circuit board, the first negative high voltage track being spaced apart from the first positive high voltage track by a first distance in a second direction perpendicular to the first direction, a first ion sense trace formed on the first printed circuit board, a first ion probe attached to the first printed circuit board and connected to the first ion sense trace, and a first connector coupled to the first positive high voltage track, the first connector configured to receive a first ion emitter.

In various embodiments, the air ionizer system further includes a second positive high voltage track formed on the first printed circuit board and inline with the first positive high voltage track, the second positive high voltage track extending in the first direction, and a second connector coupled to the second positive high voltage track, the second connector configured to receive a second ion emitter. In various embodiments, the first positive high voltage track extends a first length from the first edge in the first direction and the first ion sense trace extends a second length from the first edge in the first direction.

In various embodiments, the digital module is configured to send the instructions to the high voltage module in response to a signal received from the first ion probe. In various embodiments, the first printed circuit board is a flexible printed circuit board including a polyimide material. In various embodiments, the air ionizer system further includes an expansion stub coupled at the second edge of the first printed circuit board, the expansion stub configured to connect the first printed circuit board to a second printed circuit board.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Disclose herein is a modular, flexible, smart multi-electrode air ionizer system that is centrally controlled. In various embodiments, the air ionizer system includes a module for connecting ion emitters to a central controller. In various embodiments, the module includes a plurality of stubs where each stub is configured to mechanically and electrically connect an air ionizer to the central controller. In various embodiments, multiple modules may be daisy chained (i.e., connected in series) to one another to expand the air ionizer system. In various embodiments, the ion emitter is configured to emit a plurality of ions having a specified ion density measured in ions per cubic meter of air. In various embodiments, connecting a plurality of ion emitters to a single central controller tends to improve the control of the ion density across multiple locations.

Figure 1:
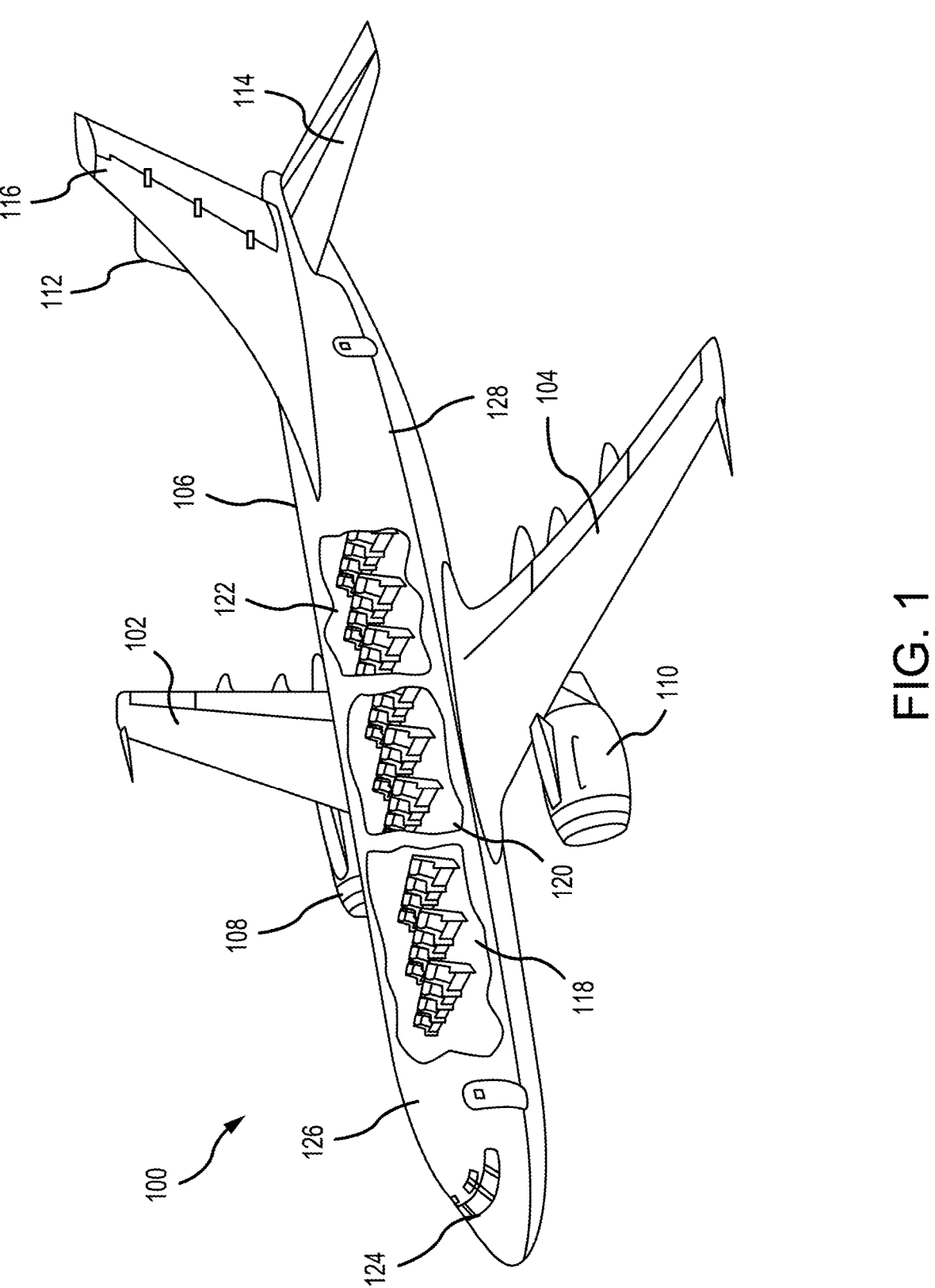
FIG. 1 illustrates an aircraft and various sections within the aircraft, in accordance with various embodiments.

Referring now to FIG. 1, an aircraft 100 including various sections within the aircraft is illustrated, in accordance with various embodiments. Aircraft 100 is an example of a passenger or transport vehicle in which smart air ionizers may be implemented in accordance with various embodiments. In various embodiments, aircraft 100 has a starboard wing 102 and a port wing 104 attached to a fuselage 106. In various embodiments, aircraft 100 also includes a starboard engine 108 connected to starboard wing 102 and a port engine 110 connected to port wing 104. In various embodiments, aircraft 100 also includes a starboard horizontal stabilizer 112, a port horizontal stabilizer 114, and a vertical stabilizer 116. In various embodiments, aircraft 100 also includes various cabin sections, including, for example, a first cabin section 118, a second cabin section 120, a third cabin section 122, and a pilot cabin 124. In various embodiments, cabin sections 118, 120, 122 may include a plurality of passenger seats and a plurality of passenger service units disposed over the plurality of passenger seats. In various embodiments, aircraft 100 may include a front lavatory 126 and/or a rear lavatory 128.

Figure 2:
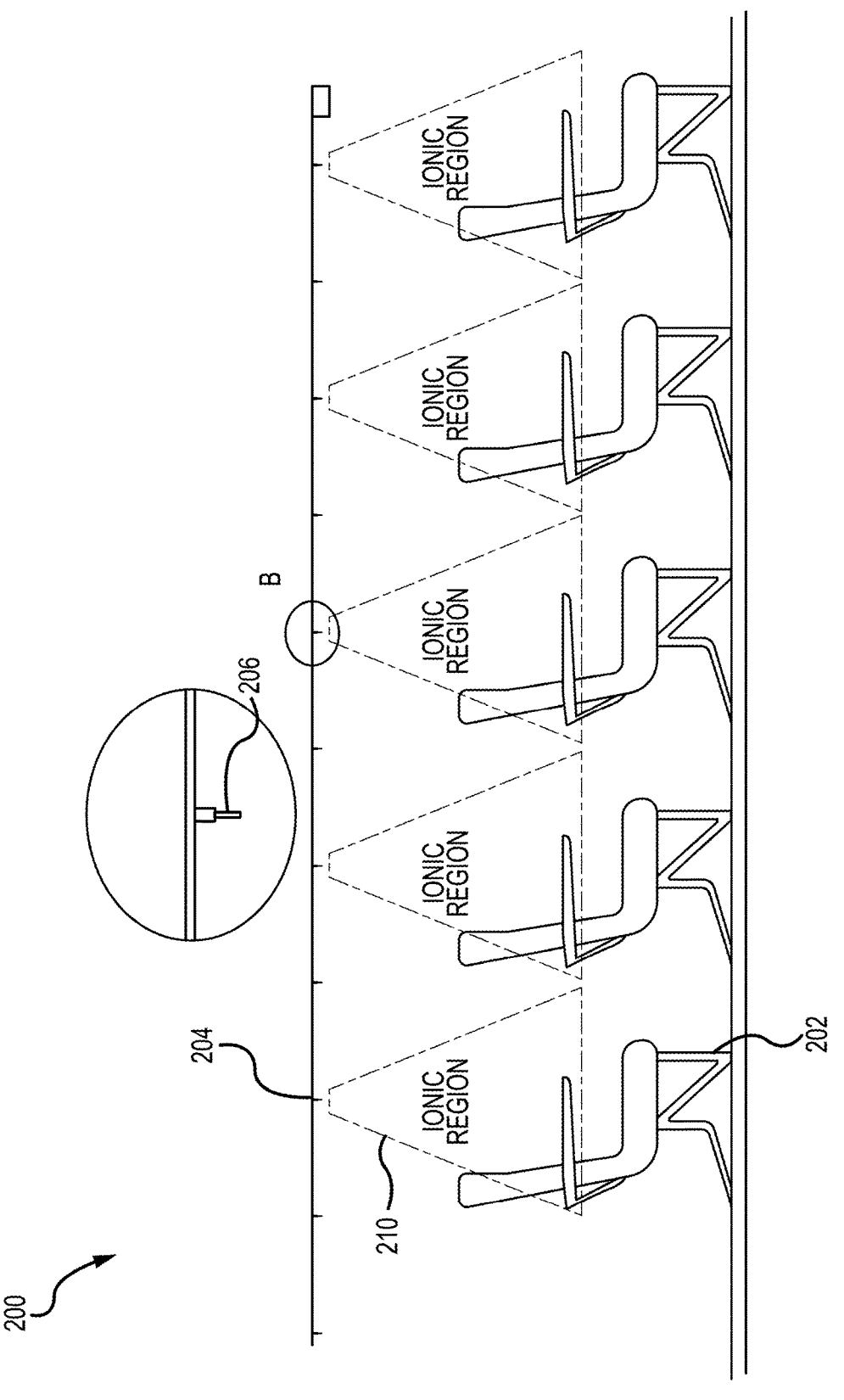
FIG. 2 illustrates a cabin of an aircraft including passenger seats and air ionizers, in accordance with various embodiments.

Referring now to FIG. 2, a side view of an aircraft cabin section 200 of an aircraft (e.g., aircraft 100) is illustrated, in accordance with various embodiments. In various embodiments, aircraft cabin section 200 may be an example of first cabin section 118, second cabin section 120, and/or third cabin section 122. Aircraft cabin section 200 includes a plurality of passenger seats 202, a plurality of electrode modules 204, and a plurality of ion emitters 206 coupled to the plurality of electrode modules 204, and an air conditioning duct 208 disposed above and coupled to the plurality of passenger service units 204.

The plurality of passenger seats 202 may be arranged in rows throughout aircraft cabin section 200. In various embodiments, one or more aisles may pass through each row of the plurality of passenger seats 202. The plurality of electrode modules 204 are disposed over the plurality of passenger seats 202. In various embodiments, the ion emitters are placed adjacent to a flow of air either from an air conditioning duct or from one or more air gaspers located in passenger service units above each of the plurality of passenger seats 202. Each ion emitter 206 ionizes the air in the flow of air creating an ionic region 210 over the plurality of passenger seats 202 that includes positive ions and a plurality of negative ions.

In various embodiments, ion emitter 206, and more specifically, the positive ions may neutralize pathogens (e.g., bacteria, viruses, molds, dust, etc.) and/or malodor (i.e., unpleasant smells) that are airborne and on surfaces. Pathogens and malodor may be generated and/or spread by passengers and activities throughout aircraft 100 and cabin section 200, among other locations. Pathogens and malodor may be airborne and/or settle on surfaces within cabin section 200 and aircraft 100, among others. Ion emitter 206 may be placed adjacent an air gasper so that ion emitter 206 ionizes the air exiting the air gasper. Generally, ions created by ion emitter 206, such as the positive ions and the negative ions, have an active life span of about 30 seconds to about 75 seconds, and more specifically, about 45 seconds to about 60 seconds. Accordingly, locating ion emitter 206 adjacent the air gaspers and/or above the plurality of passenger seats 202 improves the efficacy of the positive ions and the negative ions as compared to placing ion emitter 206 within an air conditioning system of cabin or aircraft.

Figure 3A:
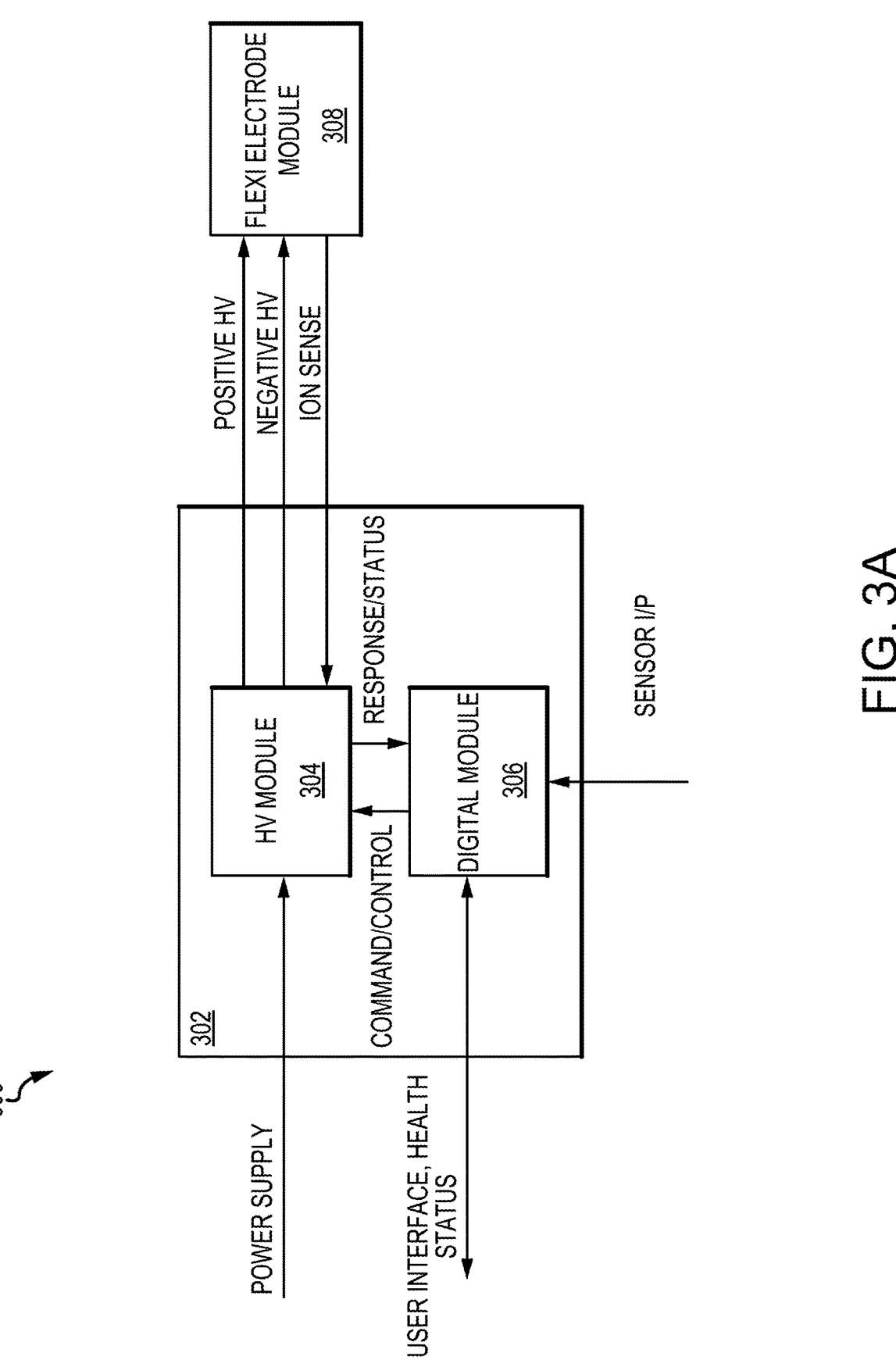
FIG. 3A illustrates a system block diagram of a centrally controlled air ionizer system, in accordance with various embodiments.

Referring now to FIG. 3A, a block diagram 300 of a centrally controlled modular air ionizer system is illustrated, in accordance with various embodiments. The centrally controlled modular air ionizer system includes a central controller 302, a high voltage module 304, a digital module 306, and a flexible electrode module 308. High voltage module 304 and digital module 306 are included in central controller 302. In various embodiments, there may be a plurality of flexible electrode modules 308. Central controller 302, including high voltage module 304 and digital module 306, is configured to power and control each of the plurality of flexible electrode modules 308.

Digital module 306 provides controls for the air ionizer system. Digital module is operatively coupled to high voltage module 304, to a user interface, and to one or more sensor inputs. Digital module 306 provides command and control of the air ionizer system by sending commands to high voltage module 304 and receive status information from high voltage module 304. Digital module 306 may further be updated through the user interface to change an ion density distribution of the air ionizer system.

Digital module 306 may comprise one or more processors configured to implement various logical operations in response to execution of instructions, for example, instructions stored on a non-transitory, tangible, computer-readable medium. The one or more processors can be a general purpose processor, a microprocessor, a microcontroller, a digital signal processor (DSP), an application specific integrated circuit (ASIC), a field programmable gate array (FPGA) or other programmable logic device, discrete or transistor logic, discrete hardware components, or any combination thereof.

Digital module 306 may further comprise memory to store data, executable instructions, system program instructions, and/or controller instructions to implement the control logic of digital module 306.

High voltage module 304 is electrically coupled to a power supply and to flexible electrode modules 308. High voltage module 304 converts the receive power from the power supply to a high voltage power supply that is provided to flexible electrode module 308. High voltage module 304 receives commands from digital module 306 and may modify the output voltage to flexible electrode module 308 in response to the received commands. High voltage module 304 receives ion count information from flexible electrode module 308 and transmits the ion count information to digital module 306.

Flexible electrode module 308 includes a plurality of stubs that are each configured to receive and power an ion emitter. In various embodiments, flexible electrode module 308 may include a plurality of flexible electrode modules 308 that are daisy changed (i.e., connected in series). In various embodiments, central controller 302 may control every ion emitter connected to the plurality of flexible electrode modules 308.

Figure 3B:
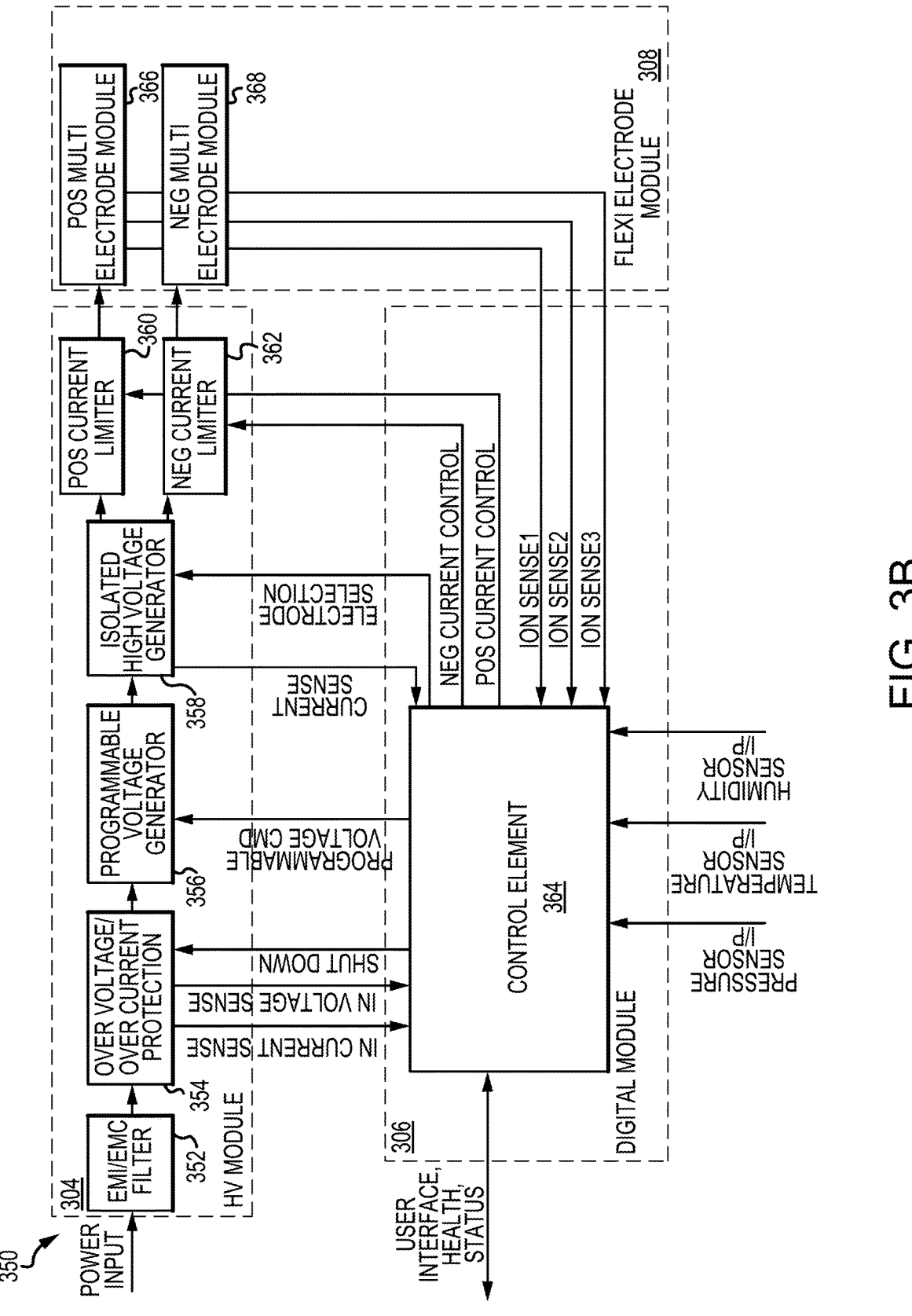
FIG. 3B illustrates a system architecture diagram of a centrally controlled air ionizer system, in accordance with various embodiments.

Referring now to FIG. 3B, an architecture diagram 350 of the centrally controlled modular air ionizer system is illustrated, in accordance with various embodiments. Architecture diagram 350 includes high voltage module 304, digital module 306, and flexible electrode module 308. Flexible electrode module 308 further includes a positive multi-electrode module 366 and a negative multi-electrode module 368, each of which may be configured to power an ion emitter.

High voltage module 304 further includes a power filter 352, a power protection circuit 354, a programmable voltage generator 356, an isolated high voltage generator 358, a positive current limiter 360, and a negative current limiter 362. In various embodiments, power filter 352 may be an electromagnetic interference (EMI) filter. In various embodiments, power filter 352 may be an electromagnetic compatibility (EMC) filter. In various embodiments, power protection circuit 354 may provide over voltage and/or over current protection to the air ionizer system.

Digital module 306 further includes a control element 364 that performs the tasks and calculations of digital module 306. In various embodiments, control element 364 receives sensor inputs from a pressure sensor, a temperature sensor, and/or a humidity sensor, among others. In various embodiments, control element 364 receives ion sensor feedback directly from flexible electrode module 308. Control element 364 is configured to control high voltage module 304 including power protection circuit 354, programmable voltage generator 356, isolated high voltage generator 358, positive current limiter 360, and negative current limiter 362.

Control element 364 may comprise one or more processors configured to implement various logical operations in response to execution of instructions, for example, instructions stored on a non-transitory, tangible, computer-readable medium. The one or more processors can be a general purpose processor, a microprocessor, a microcontroller, a digital signal processor (DSP), an application specific integrated circuit (ASIC), a field programmable gate array (FPGA) or other programmable logic device, discrete or transistor logic, discrete hardware components, or any combination thereof.

Control element 364 may further comprise memory to store data, executable instructions, system program instructions, and/or controller instructions to implement the control logic of control element 364.

Figure 4:
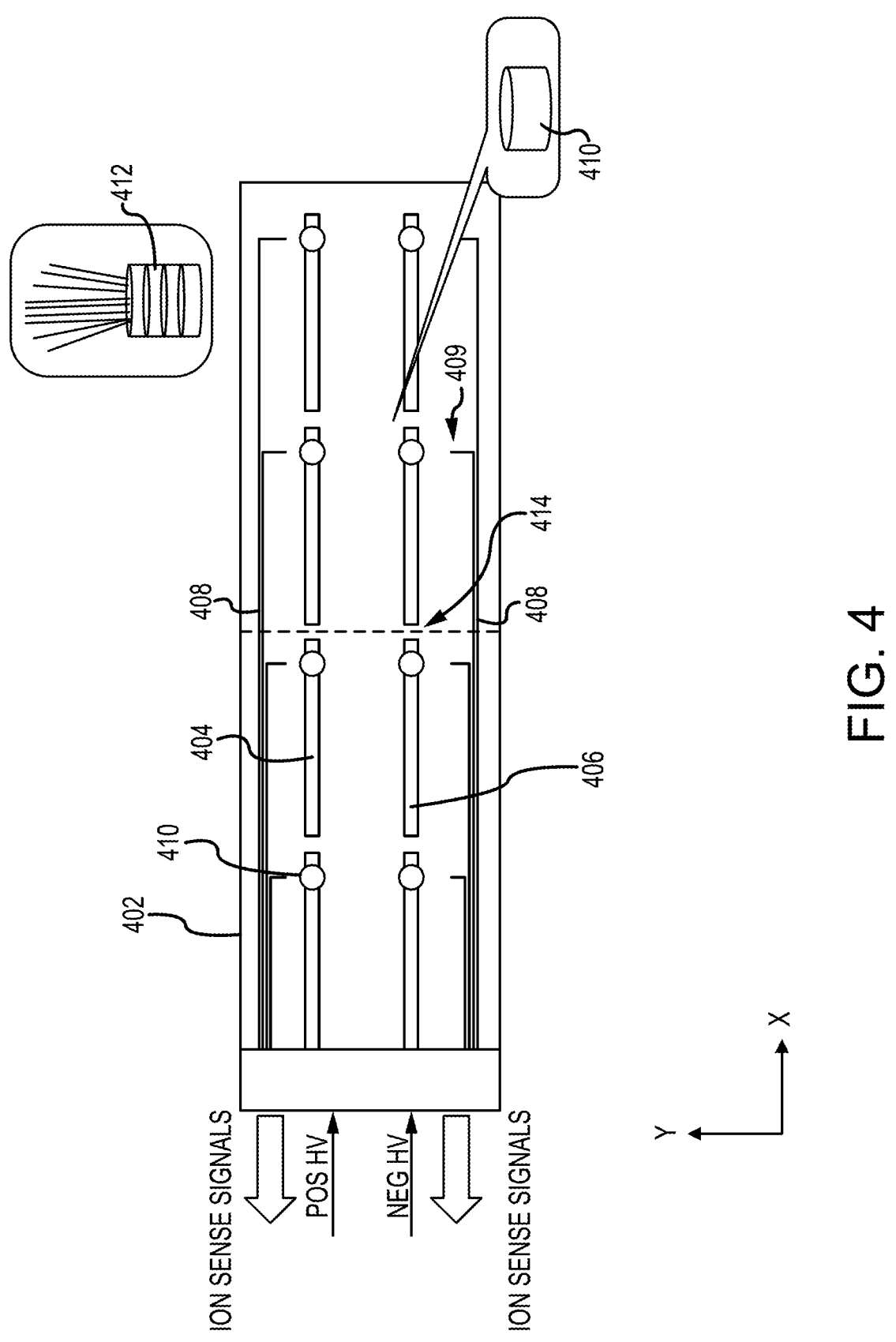
FIG. 4 illustrates a flexible electrode module and an ion emitter used in a centrally controlled air ionizer system, in accordance with various embodiments.

Referring now to FIG. 4, flexible electrode module 400 is illustrated, in accordance with various embodiments. In various embodiments, flexible electrode module 400 may be an example of flexible electrode module 308 described in FIGS. 3A and 3B. Flexible electrode module 400 interfaces with high voltage module 304. Flexible electrode module 400 includes printed circuit board (PCB) 402, a plurality of positive high voltage tracks 404, a plurality of negative high voltage tracks 406, a plurality of ion sense traces 408 each of which is coupled to a probe point 409, a plurality of connectors 410 each of which is configured to receive an ion emitter 412, and an expansion stub 414. In various embodiments, PCB 402 may include a single positive high voltage track 404, a single negative high voltage tracks 406, a single ion sense trace 408 that is coupled to a probe point 409, a single connector 410 coupled to each of the positive high voltage track 404 and the negative high voltage track 406, and expansion stub 414.

In various embodiments, PCB 402 is a flexible PCB that is able to bend and twist to fit into different locations for installation. In various embodiments, PCB 402 may include a polyimide material that is selected have a high dielectric break down in order to meet comparative tracking index (CTI) standards. That is, the polyimide material is selected to have a high voltage at which a dielectric failure on PCB 402 occurs. In other words, the polyimide material has a high dielectric strength to prevent breakdown of PCB 402 due to high voltage. In various embodiments, PCB 402 may be double insulated to improve safety of passengers from the high voltages being transferred on PCB 402.

The plurality of positive high voltage tracks 404 and the plurality of negative high voltage tracks 406 extend along a length of PCB 402 (e.g., along the x-axis) and are separate by a width of PCB 402 (e.g., along the y-axis). Each of the plurality of positive high voltage tracks 404 extends a first length and is separated from adjacent positive high voltage tracks 404 by a second length. Each of the plurality of negative high voltage tracks 406 extends a first length and is separated from adjacent negative high voltage tracks 406 by a second length. In various embodiments, the second length is less than the first length.

Connectors 410 are configured to be coupled to one of positive high voltage track 404 or negative high voltage track 406. Connector 410 may be coupled anywhere along the length of positive high voltage track 404 or negative high voltage track 406. In various embodiments, connector 410 may be permanently coupled to positive high voltage track 404 or negative high voltage track 406. In various embodiments, connector 410 may be removable coupled to positive high voltage track 404 or negative high voltage track 406. Connector 410 is further configured to receive ion emitter 412. In various embodiments, ion emitter 412 may be replaceable. That is, ion emitter 412 may be removed from connector 410 without removing connector 410 from PCB 402. In various embodiments, an outer surface of connector 410 may be insulated in order to reduce voltage leaks. This allows flexible electrode module 308 to be highly configurable with respect to the number and placement of ion emitter 412.

The plurality of ion sense traces 408 extend from an edge of PCB 402 to probe point 409. Probe point 409 is a sensor that identifies an ion density produced by ion emitters 412 and flexible electrode module 308. The ion density data is used by central controller 302 to determine whether to increase the voltage output, decrease the voltage output, or take no action. More specifically, digital module 306 determine whether to command high voltage module 304 to increase the voltage output, decrease the voltage output, or take no action.

Expansion stub 414 provides an interface at an edge of PCB 402 to connect PCB 402 to another PCB 402. As described above, each PCB 402 includes one or more positive high voltage tracks 404 and one or more negative high voltage tracks 406. This provides the ability to expand the air ionizer system to include additional ion emitters 412 and/or probe points 409. Each expansion stub 414 provides a connection for positive high voltage track 404, negative high voltage track 406, and ion sense traces 408. Expansion stub 414 is illustrated in FIG. 4 as a dotted line to indicate that two PCBs 402 are coupled together and act as a single system. Multiple PCBs 402 may be daisy chained (i.e., connected in series) in this manner to expand the air ionizer system. In various embodiments, each PCB 402, and therefore flexible electrode module 308, may include one or more positive high voltage tracks 404, one or more negative high voltage tracks 406, and one or more ion sense traces 408. In other words, each PCB 402 may be configured to support one or more ion emitters 412. Therefore, it should be appreciated that expansion stub 414, as illustrated in FIG. 4, is for illustrative and discussion purposes and is not intended to be limiting.

Figure 5A:
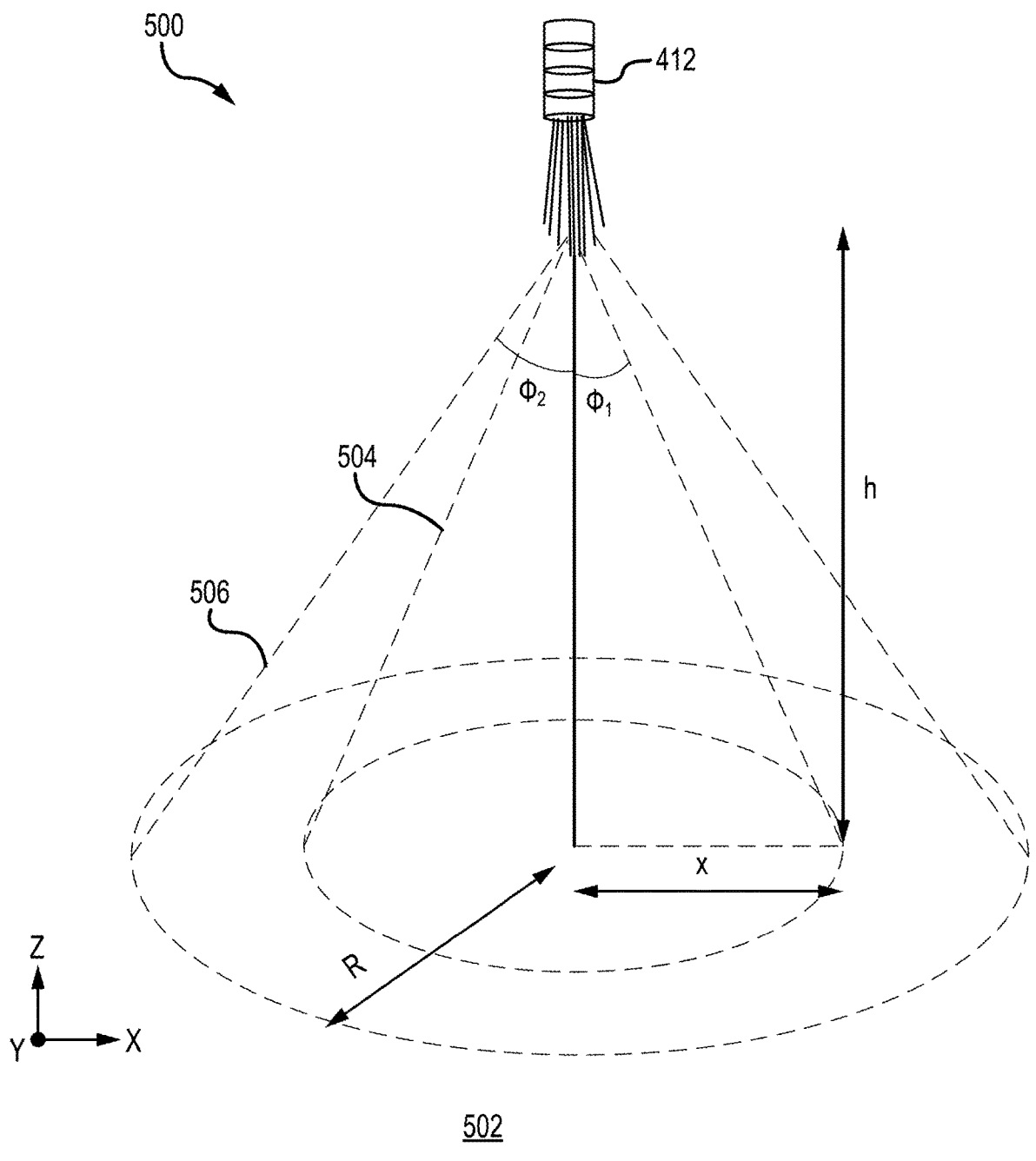
FIGS. 5A, 5B, and 5C illustrate ion density of various configurations of a centrally controlled air ionizer system, in accordance with various embodiments.
Figure 5B:
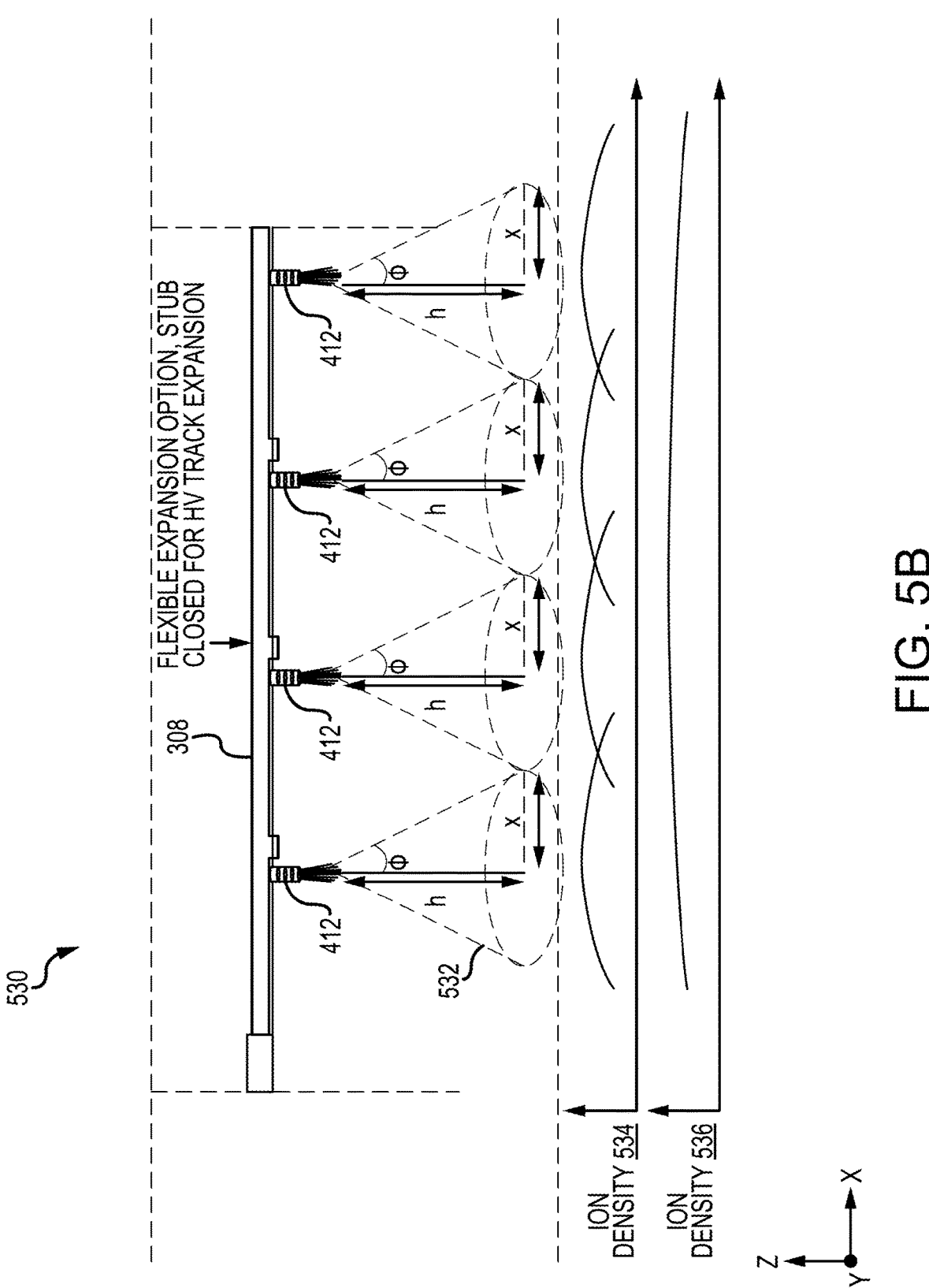
Figure 5C:
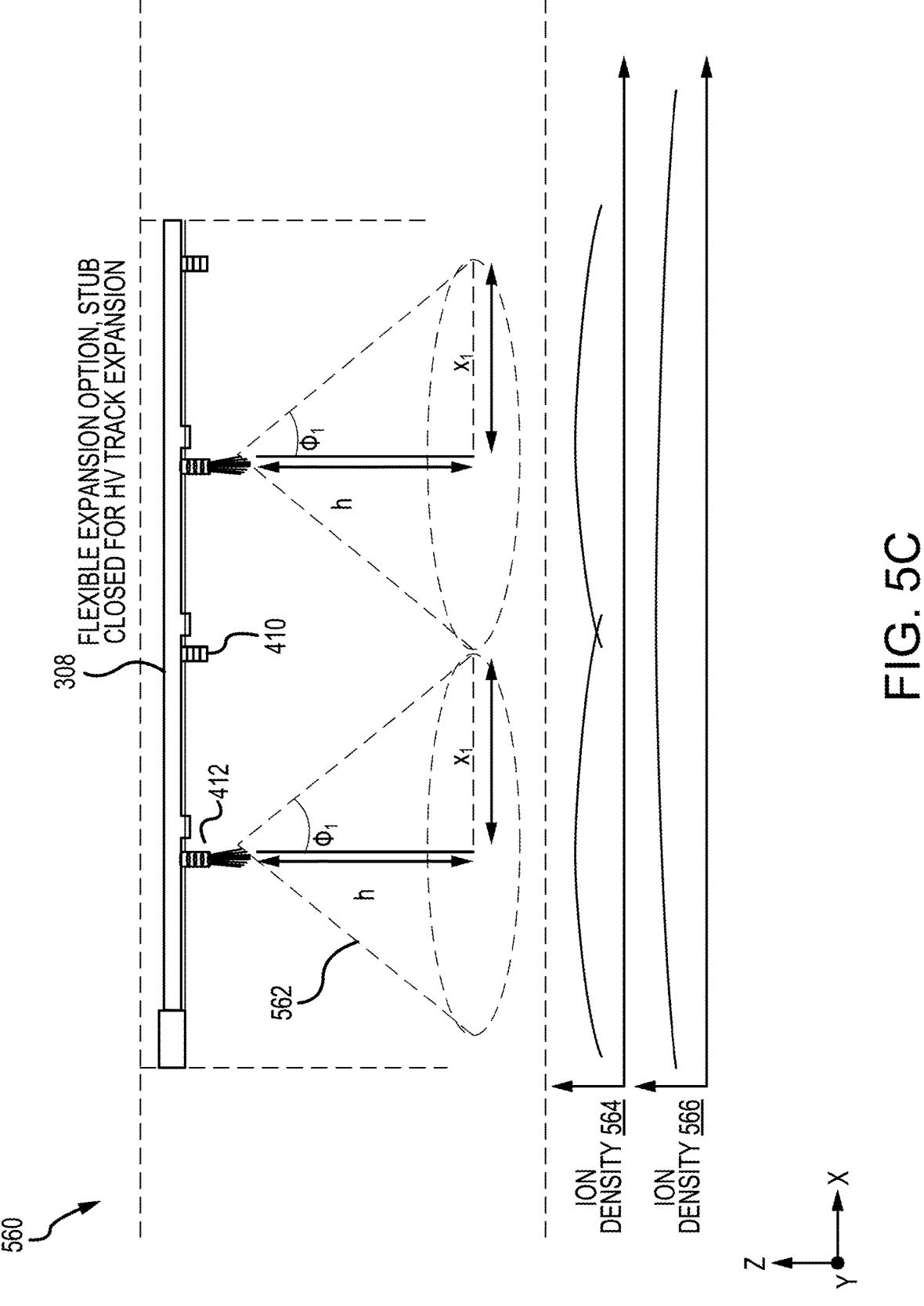

Referring now to FIGS. 5A, 5B, and 5C, different configurations of ion emitter placements and the resulting ion densities are illustrated, in accordance with various embodiments. FIG. 5A illustrates an effective area of coverage 500 for a first configuration including a single ion emitter 412 that is coupled to flexible electrode module 308. FIG. 5B illustrates an effective area of coverage 530 for a second configuration of ion emitters 412 including multiple ion emitters 412 spaced apart a first distance. FIG. 5C illustrates an effective area of coverage 560 for a third configuration of ion emitters 412 including multiple ion emitters 412 spaced apart a third distance.

FIG. 5A illustrates first area of coverage 500 using a single ion emitter 412. First area of coverage 500 may be varied by central controller 302 by increasing or decreasing the voltage output to ion emitter 412. Ion emitter 412 is operating at a height h above a floor 502. The density of ions generated by ion emitter 412 is highest closest to ion emitter 412 and decreases the further from ion emitter 412. The resulting field of ion coverage may be defined by height h and an angle of coverage $\Phi$ that is defined from a vertical axis (e.g., the z-axis). The field of ion coverage is affected by the voltage input to ion emitter 412. The higher the voltage the greater the field of ion coverage.

Given a first voltage (e.g., 2.5 kV), a first field 504 of ion coverage is generally cone shaped with height h and a base radius X resulting in a first angle of coverage $\Phi_1$. First field 504 has a first ion density distribution that is greater at the center of first field 504 than at the edges of first field 504. By increasing the input voltage to a second voltage (e.g., 6 kV), a second field 506 of ion coverage is generated. Second field 506 is generally cone shaped having the same height h as first field 504 and a wider base radius R, resulting in a second angle of coverage $\Phi_2$ that is greater than first angle of coverage $\Phi_1$. Therefore, it can be seen that by adjusting the input voltage to ion emitter 412 the area of coverage, and therefore the ion density, can be increased or decreased as desired.

FIG. 5B illustrates second area of coverage 530 using the second configuration of ion emitters 412. The second configuration includes four ion emitters 412 installed in a row. With momentary reference to FIG. 4, second configuration includes all illustrated connectors 410 and ion emitters 412 illustrated as connected to the plurality of positive high voltage tracks 404. A first voltage (e.g., 2.5 kV) is applied to each ion emitter 412 resulting in a field 532 of ion coverage from each ion emitter 412. Field 532, for each ion emitter 412, has a height h, a radius X, and an angle of coverage Φ.

A first ion distribution graph 534 illustrates the ion distribution for each ion emitter 412 in the second configuration. The ion distribution of each ion emitter 412 is highest directly below ion emitter 412 and lowest at radius X from the high point. By using multiple ion emitters 412, as in the second configuration, the field 532 of each ion emitter 412 overlaps. A second ion distribution graph 536 illustrates an effective ion distribution for all ion emitters 412 in the second configuration. While first ion distribution graph 534 shows a significant change in ion distribution for each ion emitter 412 across radius X, second ion distribution graph 536 illustrate a generally uniform ion distribution due to the overlapping of fields 532.

FIG. 5C illustrates third area of coverage 560 using the third configuration of ion emitters 412. The third configuration includes two ion emitters 412 installed in a row, with two unused connectors 410. With momentary reference to FIG. 4, third configuration includes half of the illustrated connectors 410 and ion emitters 412 illustrated as connected to the plurality of positive high voltage tracks 404. That is, an ion emitter 412 is placed in every other connector 410. A second voltage (e.g., 6 kV) is applied to each ion emitter 412 resulting in a field 562 of ion coverage from each ion emitter 412. Field 562, for each ion emitter 412, has a height h, a radius $X_1$, and an angle of coverage $\Phi_1$.

A first ion distribution graph 564 illustrates the ion distribution for each ion emitter 412 in the third configuration. The ion distribution of each ion emitter 412 is highest directly below ion emitter 412 and lowest at radius $X_1$ from the high point. By using multiple ion emitters 412, as in the third configuration, field 562 of each ion emitter 412 overlaps. A second ion distribution graph 566 illustrates an effective ion distribution for both ion emitters 412 in the third configuration. While first ion distribution graph 564 shows a significant difference in ion distribution for each ion emitter 412 across radius $X_1$, second ion distribution graph 566 illustrates a generally uniform ion distribution due to the overlapping of fields 562.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 5% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 5% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above-described concepts can be used alone or in combination with any or all of the other above-described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. An electrode module for use in an air ionizer system, comprising:
   a first printed circuit board extending in a first direction from a first edge to a second edge;
   a first positive high voltage track formed on the first printed circuit board, the first positive high voltage track extending in the first direction;
   a first negative high voltage track formed on the first printed circuit board, the first negative high voltage track being spaced apart from the first positive high voltage track by a first distance in a second direction perpendicular to the first direction;
   a first ion sense trace formed on the first printed circuit board,
   a first ion probe attached to the first printed circuit board and connected to the first ion sense trace; and
   a first connector coupled to the first positive high voltage track, the first connector configured to receive a first ion emitter.

2. The electrode module of claim 1, wherein the first printed circuit board is a flexible printed circuit board including a polyimide material.

3. The electrode module of claim 1, wherein the first positive high voltage track extends a first length from the first edge in the first direction and the first ion sense trace extends a second length from the first edge in the first direction.

4. The electrode module of claim 3, wherein the first negative high voltage track extends the first length from the first edge in the first direction.

5. The electrode module of claim 3, wherein the first ion sense trace being parallel to the first positive high voltage track.

6. The electrode module of claim 1, further comprising:
   an expansion stub coupled at the second edge of the first printed circuit board, the expansion stub configured to connect the first printed circuit board to a second printed circuit board.

7. The electrode module of claim 1, wherein the first ion probe is disposed adjacent the first connector.

8. An air ionizer system, comprising:
   a high voltage module configured to output a high voltage;
   a digital module operatively coupled to the high voltage module and configured send instructions to the high voltage module to vary a high voltage output;
   an electrode module operatively coupled to the high voltage module, the electrode module including:
      a first printed circuit board extending in a first direction from a first edge to a second edge;

a first positive high voltage track formed on the first printed circuit board, the first positive high voltage track extending in the first direction;
a first negative high voltage track formed on the first printed circuit board, the first negative high voltage track being spaced apart from the first positive high voltage track by a first distance in a second direction perpendicular to the first direction;
a first ion sense trace formed on the first printed circuit board,
a first ion probe attached to the first printed circuit board and connected to the first ion sense trace; and
a first connector coupled to the first positive high voltage track, the first connector configured to receive a first ion emitter.

9. The air ionizer system of claim 8, further comprising:
   a second positive high voltage track formed on the first printed circuit board and inline with the first positive high voltage track, the second positive high voltage track extending in the first direction; and
   a second connector coupled to the second positive high voltage track, the second connector configured to receive a second ion emitter.

10. The air ionizer system of claim 9, further comprising:
   a third positive high voltage track formed on the first printed circuit board inline with and between the first positive high voltage track and the second positive high voltage track, the second positive high voltage track extending in the first direction, wherein an ion emitter of a plurality of ion emitters is coupled to alternating positive high voltage tracks.

11. The air ionizer system of claim 8, wherein the first printed circuit board is a flexible printed circuit board including a polyimide material.

12. The air ionizer system of claim 8, wherein the first positive high voltage track extends a first length from the first edge in the first direction and the first ion sense trace extends a second length from the first edge in the first direction.

13. The air ionizer system of claim 8, wherein the first positive high voltage track extends a first length from the first edge in the first direction and the first ion sense trace extends a second length from the first edge in the first direction.

14. The air ionizer system of claim 8, wherein the digital module is configured to send the instructions to the high voltage module in response to a signal received from the first ion probe.

15. An aircraft, comprising:
   a plurality of passenger seats; and
   an air ionizer system disposed over the plurality of passenger seats, the air ionizer system including:
      a high voltage module configured to output a high voltage;
      a digital module operatively coupled to the high voltage module and configured send instructions to the high voltage module to vary a high voltage output;
      an electrode module operatively coupled to the high voltage module, the electrode module including:
         a first printed circuit board extending in a first direction from a first edge to a second edge;
         a first positive high voltage track formed on the first printed circuit board, the first positive high voltage track extending in the first direction;
         a first negative high voltage track formed on the first printed circuit board, the first negative high voltage track being spaced apart from the first positive high voltage track by a first distance in a second direction perpendicular to the first direction;

a first ion sense trace formed on the first printed circuit board, a first ion probe attached to the first printed circuit board and connected to the first ion sense trace; and a first connector coupled to the first positive high voltage track, the first connector configured to receive a first ion emitter.

16. The aircraft of claim 15, wherein the air ionizer system further comprises:

a second positive high voltage track formed on the first printed circuit board and inline with the first positive high voltage track, the second positive high voltage track extending in the first direction; and a second connector coupled to the second positive high voltage track, the second connector configured to receive a second ion emitter.

17. The aircraft of claim 15, wherein the first positive high voltage track extends a first length from the first edge in the first direction and the first ion sense trace extends a second length from the first edge in the first direction.

18. The aircraft of claim 15, wherein the digital module is configured to send the instructions to the high voltage module in response to a signal received from the first ion probe.

19. The aircraft of claim 15, wherein the first printed circuit board is a flexible printed circuit board including a polyimide material.

20. The aircraft of claim 15, wherein the air ionizer system further comprises:

an expansion stub coupled at the second edge of the first printed circuit board, the expansion stub configured to connect the first printed circuit board to a second printed circuit board.

* * * * *